(12) United States Patent
Almeida et al.

(10) Patent No.: US 11,569,633 B2
(45) Date of Patent: Jan. 31, 2023

(54) APPARATUS FOR PROVIDING OPTICAL RADIATION

(71) Applicant: Trumpf Laser UK Limited, Hedge End (GB)

(72) Inventors: Paulo Almeida, Cambridge (GB); Christophe Andre Codemard, Eastleigh (GB); Michael Kevan Durkin, Southampton (GB)

(73) Assignee: Trumpf Laser UK Limited, Hedge End (GB)

( * ) Notice: Subject to any disclaimer, the term of this patent is extended or adjusted under 35 U.S.C. 154(b) by 336 days.

(21) Appl. No.: 16/762,527

(22) PCT Filed: Nov. 23, 2018

(86) PCT No.: PCT/GB2018/000149
§ 371 (c)(1),
(2) Date: May 8, 2020

(87) PCT Pub. No.: WO2019/102174
PCT Pub. Date: May 31, 2019

(65) Prior Publication Data
US 2020/0280164 A1    Sep. 3, 2020

(30) Foreign Application Priority Data
Nov. 24, 2017   (GB) ..................... 1719629

(51) Int. Cl.
*H01S 3/23*       (2006.01)
*H01S 3/081*      (2006.01)
(Continued)

(52) U.S. Cl.
CPC ............ *H01S 3/2308* (2013.01); *H01S 3/083* (2013.01); *H01S 3/0816* (2013.01);
(Continued)

(58) Field of Classification Search
CPC ...... H01S 3/2308; H01S 3/0816; H01S 3/083; H01S 3/1305; H01S 3/1315; H01S 3/136; H01S 3/1666
See application file for complete search history.

(56) References Cited

U.S. PATENT DOCUMENTS 6,151,338 A    11/2000  Grubb et al.
6,314,117 B1 *  11/2001  Heim .................. H01S 5/02257
                                                  257/434
(Continued)

FOREIGN PATENT DOCUMENTS

JP    4689008 B2 *  5/2011  ........... G02F 1/3519
WO    9318561 A1    9/1993

OTHER PUBLICATIONS

Written Opinion of the International Searching Authority, International Application No. PCT/GB2018/000149, dated 23, 2019, seven (7) pages.
(Continued)

*Primary Examiner* — Xinning(Tom) Niu
(74) *Attorney, Agent, or Firm* — Iandiorio, Teska & Coleman, LLP

(57) ABSTRACT

Apparatus for providing optical radiation (15), which apparatus comprises an optical input (13), a coupler (2), a first semiconductor amplifier (3), a controller (4), a preamplifier (61), a power amplifier (62) and an output fibre (5), wherein: the optical input (13) is for receiving input optical radiation (14); the optical input (13) is connected in series to the coupler (2), the first semiconductor amplifier (3), the preamplifier (61), the power amplifier (62), and the output fibre (5); the apparatus being characterized in that: the first semiconductor amplifier (3) comprises a waveguide (6) having a low reflecting facet (8); the first semiconductor amplifier (3) is in a double pass configuration such that the low reflecting facet (8) is connected to both the optical input
(Continued)

(13) and the preamplifier (61) via the coupler (2); and the controller (4) is configured to cause the waveguide (6) of the first semiconductor amplifier (3) to operate in saturation thereby enabling the first semiconductor amplifier (3) to reduce non-linear effects in the preamplifier (61), the power amplifier (62), and the output fibre (5).

19 Claims, 10 Drawing Sheets

(51) Int. Cl.
  *H01S 3/083* (2006.01)
  *H01S 3/13* (2006.01)
  *H01S 3/131* (2006.01)
  *H01S 3/136* (2006.01)
  *H01S 3/16* (2006.01)

(52) U.S. Cl.
  CPC ............ *H01S 3/1305* (2013.01); *H01S 3/136* (2013.01); *H01S 3/1315* (2013.01); *H01S 3/1666* (2013.01)

(56) References Cited

U.S. PATENT DOCUMENTS

| | | |
|---|---|---|
| 6,456,429 B1 | 9/2002 | Wu |
| 6,674,969 B1* | 1/2004 | Ogusu .................... H04J 14/02 398/91 |
| 2004/0179559 A1* | 9/2004 | Butterworth ............ H01S 5/141 372/21 |
| 2007/0248136 A1* | 10/2007 | Leonardo ........... B23K 26/0673 372/55 |
| 2008/0018988 A1 | 1/2008 | Davidson |
| 2009/0296759 A1 | 12/2009 | Starodoumov |
| 2010/0027571 A1* | 2/2010 | Murdoch ................ H01S 3/109 372/21 |
| 2011/0032605 A1 | 2/2011 | Kliner et al. |
| 2013/0308333 A1 | 11/2013 | Alphonse |

OTHER PUBLICATIONS

Search Report, UK Intellectual Property Office, for Application No. GB1719629.6, dated Jun. 1, 2018, five (5) pages.

* cited by examiner

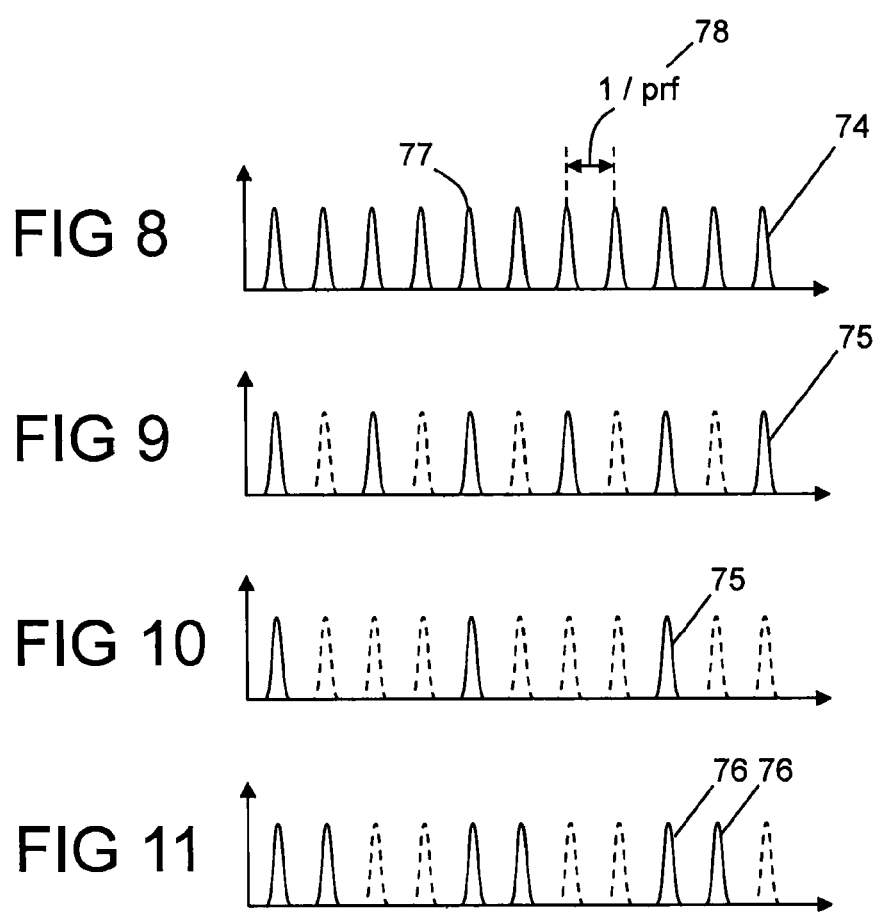

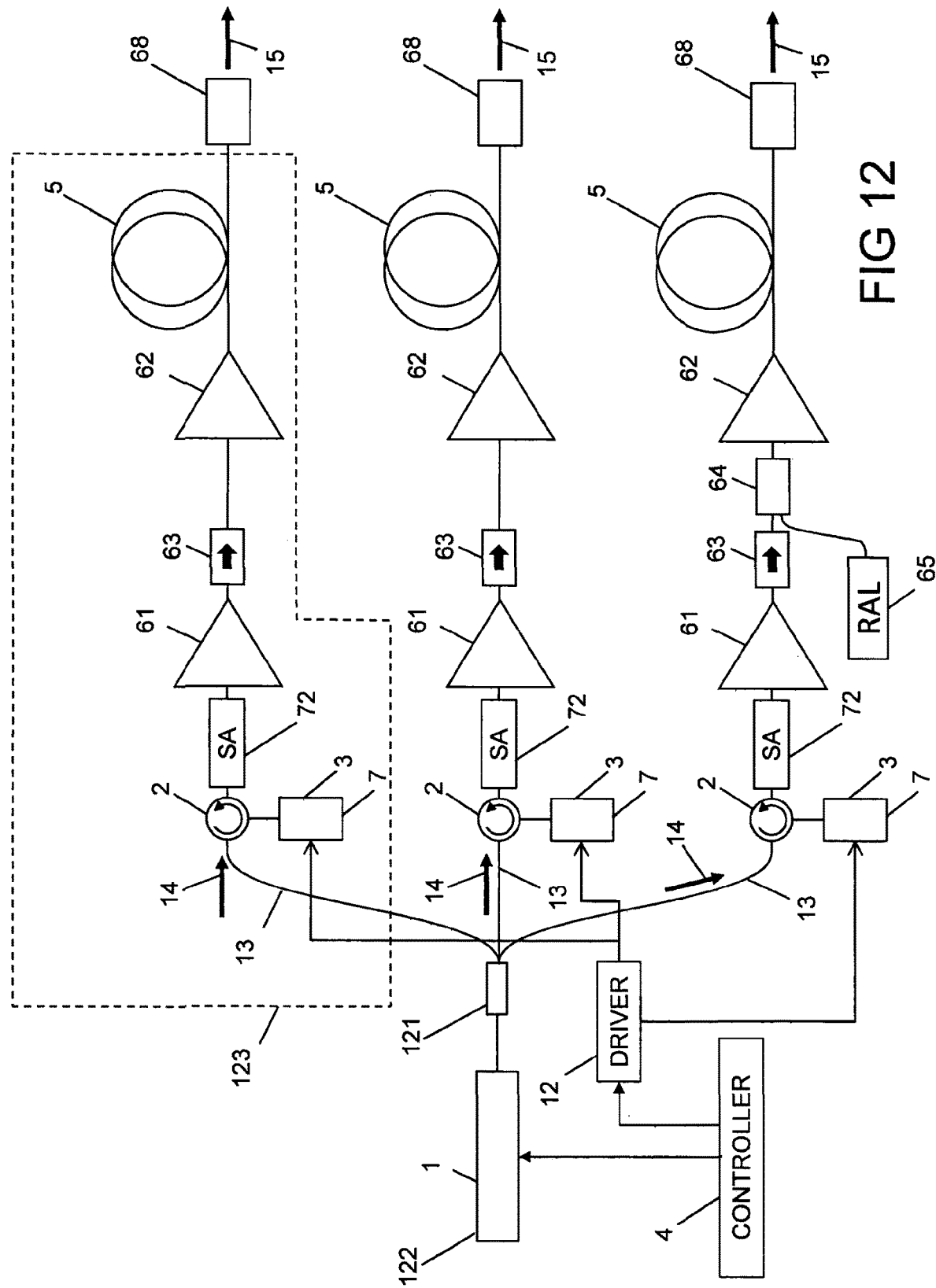

APPARATUS FOR PROVIDING OPTICAL RADIATION

FIELD OF INVENTION

This invention relates to apparatus for providing optical radiation. The invention has particular application for continuous wave and pulsed lasers including semiconductor diode lasers and fibre lasers, and for marking, cutting, scribing and welding with such lasers. The invention also has application for lasers used for processing highly reflective materials such as copper and diamonds, and for additive manufacturing.

BACKGROUND TO THE INVENTION

Industrial lasers such as fibre lasers and disk lasers have important applications for marking, cutting, scribing, welding, additive manufacturing, and other industrial processing of materials. The lasers are used in many industries including consumer electronics, medical devices, automotive, and aerospace. The lasers can be pulsed or continuous wave. Typical pulse lengths that are achievable range from a few picoseconds through nanoseconds, microseconds and milliseconds. The pulse repetition rate is controlled electronically and can be varied over a wide range.

As power levels and intensities increase, so do problems associated with non-linear effects, for example, spectral noise, temporal noise, speckle, non-linear wavelength conversion of the optical radiation, and self Q-switching. These non-linear effects are undesirable in industrial processing systems where repeatability of a process is required. For example, wavelength conversion causes errors in optical focussing systems and can reduce the optical power able to be delivered to a material, and self Q-switching can destroy optical amplifiers and optical fibres in the laser system.

A partial solution is to use a superluminescent diode as a seed laser in a master oscillator power amplifier in order to increase the bandwidth of the optical radiation and thus reduced the onset of non-linear effects. This solution has allowed power levels to be increased. However, as the power level is increased further, the power amplifier can suffer from non-linear effects. Moreover, the superluminescent diode can start to emit coherent laser radiation, that is, the superluminescent diode can start to lase. This further exacerbates non-linear effects in the power amplifier and in optical fibre delivery systems, and can lead to catastrophic failure of the power amplifier and optical fibre delivery system.

Spatial instabilities are undesirable because they affect the beam pointing stability of the optical radiation which is detrimental in industrial processing applications. This is a particular problem for multimode power amplifiers and multimode beam delivery fibres. The problem becomes more acute as power levels are increased owing to the aforementioned non-linear effects. In addition, spectral and temporal noise of seed lasers can exacerbate these non-linear effects.

There is a need for apparatus for providing optical radiation that avoids or reduces the aforementioned problems.

The Invention

According to the present invention there is provided apparatus for providing optical radiation, which apparatus comprises an optical input, a coupler, a first semiconductor amplifier, a controller, a preamplifier, a power amplifier, an output fibre, and a resonant cavity, wherein:

the optical input is for receiving input optical radiation;

the optical input is connected in series to the coupler, the first semiconductor amplifier, the preamplifier, the power amplifier, and the output fibre, and the resonant cavity;

the resonant cavity comprises a non-linear crystal;

the resonant cavity is connected to the optical input thereby forming a ring laser comprising the coupler, the first semiconductor amplifier, the preamplifier, the power amplifier, the output fibre, and the resonant cavity;

the first semiconductor amplifier comprises a waveguide having a low reflecting facet;

the first semiconductor amplifier is in a double pass configuration such that the low reflecting facet is connected to both the optical input and the preamplifier via the coupler;

the controller is configured to cause the waveguide of the first semiconductor amplifier to operate in saturation thereby enabling the first semiconductor amplifier to reduce non-linear effects in the preamplifier, the power amplifier, and the output fibre;

the resonant cavity operates to provide optical feedback in the form of the input optical radiation; and the first semiconductor amplifier is configured to supply optical radiation to the preamplifier in the event that the optical feedback is lost in order to prevent failure of the power amplifier.

Examples of non-linear effects include spectral noise, temporal noise, speckle, non-linear wavelength conversion of the optical radiation, and self Q-switching.

The first semiconductor amplifier may be defined by an optical lasing threshold in the absence of the input optical radiation. The controller may be configured to cause the waveguide of the first semiconductor amplifier to emit an output signal having an output power greater than the optical lasing threshold when the input optical radiation is present. Preferably the controller may be configured to cause the waveguide of the first semiconductor amplifier to emit an output signal having an output power at least two times greater than the optical lasing threshold when the input optical radiation is present. More preferably the controller may be configured to cause the waveguide of the first semiconductor amplifier to emit an output signal having an output power at least three times greater than the optical lasing threshold when the input optical radiation is present.

The controller and the first semiconductor amplifier may be such that the first semiconductor amplifier lases in the absence of the input optical radiation, and the first semiconductor amplifier is prevented from lasing by the presence of the input optical radiation.

The ability to operate the first semiconductor amplifier at power levels that exceed its optical lasing threshold allows significant increases in the achievable output powers of pulsed and continuous wave laser systems without incurring the limitations caused by non-linear effects such as, for example, stimulated Brillouin scattering, stimulated Raman scattering, and four-wave mixing. The first semiconductor amplifier, when operated in saturation, can improve the signal to noise ratio present in the input optical radiation. In addition, the first semiconductor amplifier replicates the spectral properties of the input optical radiation. Reducing the noise amplitude of the optical radiation entering into the power amplifier reduces the amount of non-linear effects such as stimulated Raman scattering. It therefore permits larger signals to be input into the power amplifier before the non-linear effects become problematic. For optical fibre laser systems, its inclusion therefore allows an increase in amplification without requiring an additional optical fibre amplification stage.

Surprisingly, it is possible to operate the first semiconductor amplifier at intensity levels that would normally cause it to be unstable or lase. This is achieved by optically injecting optical radiation from an optical source which is then amplified by the first semiconductor amplifier in a double pass configuration, and then output via the output fibre. The power of the input optical radiation is selected such that the first semiconductor amplifier does not lase. The power of the input optical radiation is preferably greater than the power of reflections that make the first semiconductor amplifier lase at the optical lasing threshold.

The controller may be configured to control an optical gain of the first semiconductor amplifier such that the optical gain is reduced in the absence of the input optical radiation thereby preventing the first semiconductor amplifier from lasing. Advantageously, reducing the optical gain by reducing the drive current into the first semiconductor amplifier can be used to prevent catastrophic failure of the laser system when the input optical radiation is not present.

The apparatus may include an optical source for providing the input optical radiation. The optical source may be connected to the optical input. The optical source may be selected such that the input optical radiation has a power greater than a power of reflections from the apparatus that cause the first semiconductor amplifier to lase when the input optical radiation is not present.

A particularly attractive arrangement is where the optical source is a superluminescent diode. The optical source acts as a seed laser which provides a predetermined spectral content of the optical radiation, and the first semiconductor amplifier provides amplification. The result is a broadband source which can act as a seed laser in a high power industrial pulsed laser, reducing non-linear effects, and thus enabling much higher output powers to be achieved with less amplifying stages. This provides advantages in output power, cost, power consumption, and simplicity.

The waveguide may be a curved waveguide. This allows the attainment of higher power in the optical radiation emitted by the apparatus.

The apparatus may include a saturable absorber between the coupler and the first preamplifier in order to reduce noise between pulses of the optical radiation.

The apparatus may include a second semiconductor amplifier configured to receive the input optical radiation prior to amplification by the first semiconductor amplifier.

The second semiconductor amplifier may be operated in continuous wave operation below its lasing threshold. This can prevent catastrophic failure of the power amplifier in the event that the input optical radiation is interrupted for any reason.

The input optical radiation may comprise a pulse train having a pulse repetition frequency, and the controller may cause the first semiconductor amplifier to down-select the pulse repetition frequency.

The apparatus may include a mode locked laser to provide the pulse train.

The apparatus may include a power splitter to direct the pulse train to a plurality of amplifier chains. Each amplifier chain may include a first semiconductor amplifier.

The input optical radiation may be provided by a random fibre laser. A random fibre laser can provide an output that has a higher signal to noise ratio than conventional fibre lasers. When combined with the signal to noise improvements obtainable by operating the first semiconductor amplifier in saturation, this leads to a new class of fibre lasers that can achieve higher powers before non-linear effects such as stimulated Raman scattering becomes a problem.

The resonant cavity operates through non-linear optical effects that are highly dependent on the instantaneous optical power and instantaneous wavelength of the output radiation. Operating the first semiconductor amplifier in saturation reduces the spectral noise, temporal noise, and non-linear wavelength conversion of the output radiation, which therefore results in a far more stable operation of the resonant cavity and thus a lower noise and more stable frequency converted radiation. Such a configuration can also help reduce catastrophic failure of the ring laser in the event that feedback from the resonant cavity is lost, particularly when setting up and aligning the apparatus. This is because the first semiconductor amplifier can be configured to output optical radiation in the absence of the optical radiation provided by the optical source.

The input optical radiation may be provided by a semiconductor diode. The semiconductor diode may be a superluminescent diode. The semiconductor diode may comprise a curved waveguide.

The apparatus may include an optical attenuator located between the optical input and the coupler. The optical attenuator is preferably a variable optical attenuator. The controller may adjust the optical attenuator such that the first semiconductor amplifier is operated in saturation.

The output fibre may be a hollow core fibre. The output fibre may be a polarisation maintaining hollow core fibre.

The power amplifier may be a single mode amplifier.

The power amplifier may be a multimode amplifier. The apparatus may include an optical mode mixer between the preamplifier and the power amplifier. The inclusion of the optical mode mixer is advantageous because it reduces spatial and temporal instabilities in the power amplifier, thus reducing pointing instabilities in material processing applications.

The power amplifier may comprise an optical fibre amplifier. Alternatively or additionally, the power amplifier may comprise a free-space solid state amplifier such as a rod amplifier or a slab amplifier.

The apparatus may include an optical isolator between the preamplifier and the power amplifier.

The apparatus may comprise an optical filter between the optical input and the first semiconductor amplifier.

The apparatus may comprise an optical isolator between the optical input and the coupler.

The coupler may be an optical circulator.

The apparatus may comprise an optical isolator between the coupler and the preamplifier.

The apparatus may include a visible light source connected to a wavelength division multiplexer. The wavelength division multiplexer may be located between the coupler and the power amplifier. The visible light source may have a wavelength between 500 nm and 670 nm, and preferably between 600 nm and 670 nm. The provision of a visible light source is useful when installing the apparatus in other equipment, and for detecting faults in the power amplifier and the output fibre.

The apparatus may include a depolariser between the coupler and the preamplifier.

The apparatus may include an output beam optic at the distal end of the output fibre. The output beam optic may comprise at least one of an isolator, a collimating lens system, an anti-reflection coating, an optical detector, and a source of visible optical radiation.

The invention also provides a method for providing optical radiation, which method comprises:

provinding an optical input, a coupler, a first semiconductor amplifier, a preamplifier, a power amplifier, an output fibre, and a resonant cavity that are configured in series;

providing a non-linear crystal in the resonant cavity;

amplifying input optical radiation received by the optical input by the first semiconductor amplifier, the preamplifier, and the power amplifier;

outputting the optical radiation from the power amplifier to the resonant cavity via the output fibre;

forming a ring laser by connecting the resonant cavity to the optical input;

configuring a controller to cause the waveguide to operate in saturation thereby enabling a reduction of at least one of spectral noise, temporal noise, and non-linear wavelength conversion of the optical radiation;

using a detector to detect for an absence of the input optical radiation; and reducing an optical gain of the first semiconductor amplifier in order to prevent the first semiconductor amplifier from lasing, wherein the first semiconductor amplifier comprises a waveguide having a low reflecting facet;

the first semiconductor amplifier is in a double pass configuration such that the low reflecting facet is connected to both the optical input and the preamplifier via the coupler.

The first semiconductor amplifier may be defined by an optical lasing threshold in the absence of the input optical radiation, and the method may include the steps of providing the input optical radiation, and causing the waveguide to emit an output signal having an output power greater than the optical lasing threshold. The output signal may have an output power greater than two times the optical lasing threshold. The output signal may have an output power greater than three times the optical lasing threshold.

The method may include the step of preventing the first semiconductor amplifier from lasing by providing the input optical radiation.

The method may include the step of removing the optical radiation, and reducing an optical gain of the first semiconductor amplifier thereby preventing the first semiconductor amplifier from lasing.

The method may include the step of selecting an optical source which provides the input optical radiation such that the input optical radiation has a power greater than a power of reflections from the apparatus that causes the first semiconductor amplifier to lase when the input optical radiation is not present.

The present invention also provides a method for preventing failure of a ring laser, which method comprises:

providing an optical input, a coupler, a first semiconductor amplifier, a preamplifier, a power amplifier, an output fibre, and a resonant cavity that are configured in series;

providing a non-linear crystal in the resonant cavity;

forming the ring laser by connecting the resonant cavity to the optical input;

amplifying input optical radiation received by the optical input by the first semiconductor amplifier, the preamplifier, and the power amplifier;

outputting optical radiation from the power amplifier to the resonant cavity via the output fibre;

configuring a controller to cause the waveguide to operate in saturation thereby enabling a reduction of at least one of spectral noise, temporal noise, and non-linear wavelength conversion of the optical radiation;

causing the resonant cavity to provide optical feedback in the form of the input optical radiation; and configuring the first semiconductor amplifier to supply optical radiation to the preamplifier in the event that the optical feedback is lost in order to prevent failure of the power amplifier, wherein the first semiconductor amplifier comprises a waveguide having a low reflecting facet; and the first semiconductor amplifier is in a double pass configuration such that the low reflecting facet is connected to both the optical input and the preamplifier via the coupler.

The waveguide may be a curved waveguide.

The invention also provides an apparatus for providing optical radiation according to the method of the invention.

The invention also provides a usage of a first semiconductor amplifier in saturation for improving signal to noise ratio and thereby reducing non-linear optical effects in optical fibre amplifiers.

The invention also provides a usage of a first semiconductor amplifier for performing the method of the invention.

The method of the invention may include a step or steps as required to utilize the above mentioned optional aspects of the apparatus of the invention.

BRIEF DESCRIPTION OF THE DRAWINGS

Embodiments of the invention will now be described solely by way of example and with reference to the accompanying drawings in which:

FIGS. 8 to 11 show optical pulse trains with and without pulse picking;

FIG. 12 shows apparatus according to the present invention in which the output of an optical source is divided into separate amplifier chains each comprising a first semiconductor optical amplifier;

DETAILED DESCRIPTION OF PREFERRED EMBODIMENTS OF THE INVENTION

Figure 1:
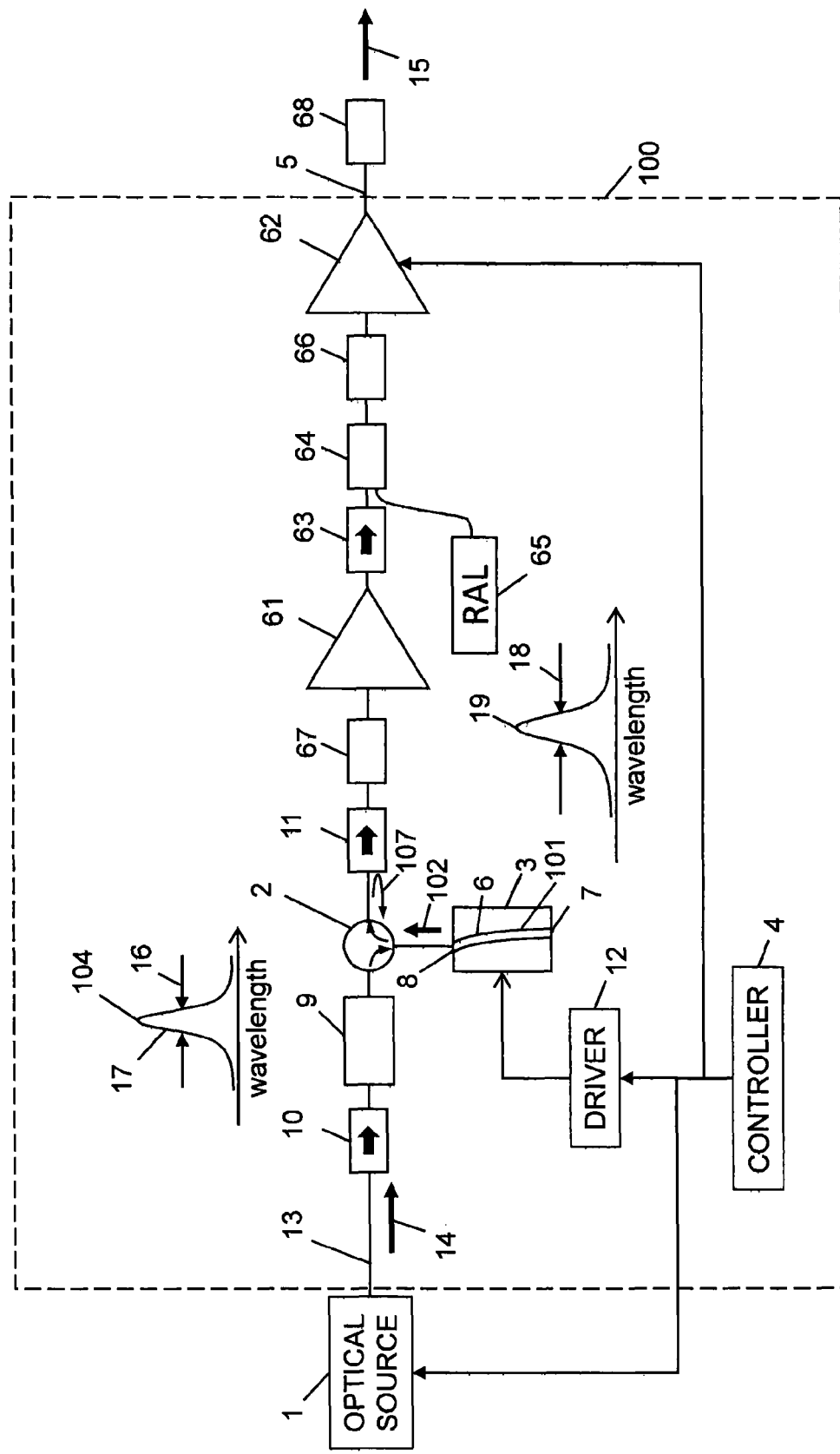
FIG. 1 shows apparatus for providing optical radiation according to the present invention.

FIG. 1 shows apparatus 100 for providing optical radiation 15, which apparatus comprises an optical input 13, a coupler 2, a first semiconductor amplifier 3, a controller 4, a preamplifier 61, a power amplifier 62 and an output fibre 5, wherein:

the optical input 13 is for receiving input optical radiation 14;

the optical input 13 is connected in series to the coupler 2, the first semiconductor amplifier 3, the preamplifier 61, the power amplifier 62, and the output fibre 5;

the apparatus being characterized in that the first semiconductor amplifier 3 comprises a waveguide 6, having a low reflecting facet 8;

the first semiconductor amplifier 3 is in a double pass configuration such that the low reflecting facet 8 is connected to both the optical input 13 and the preamplifier 61 via the coupler 2; and the controller 4 is configured to cause the waveguide 6 of the first semiconductor amplifier 3 to operate in saturation thereby enabling the first semiconductor amplifier 3 to reduce non-linear effects in the preamplifier 61, the power amplifier 62, and the output fibre 5.

Examples of non-linear effects include spectral noise, temporal noise, speckle, non-linear wavelength conversion of the optical radiation, and self Q-switching.

Figure 2:
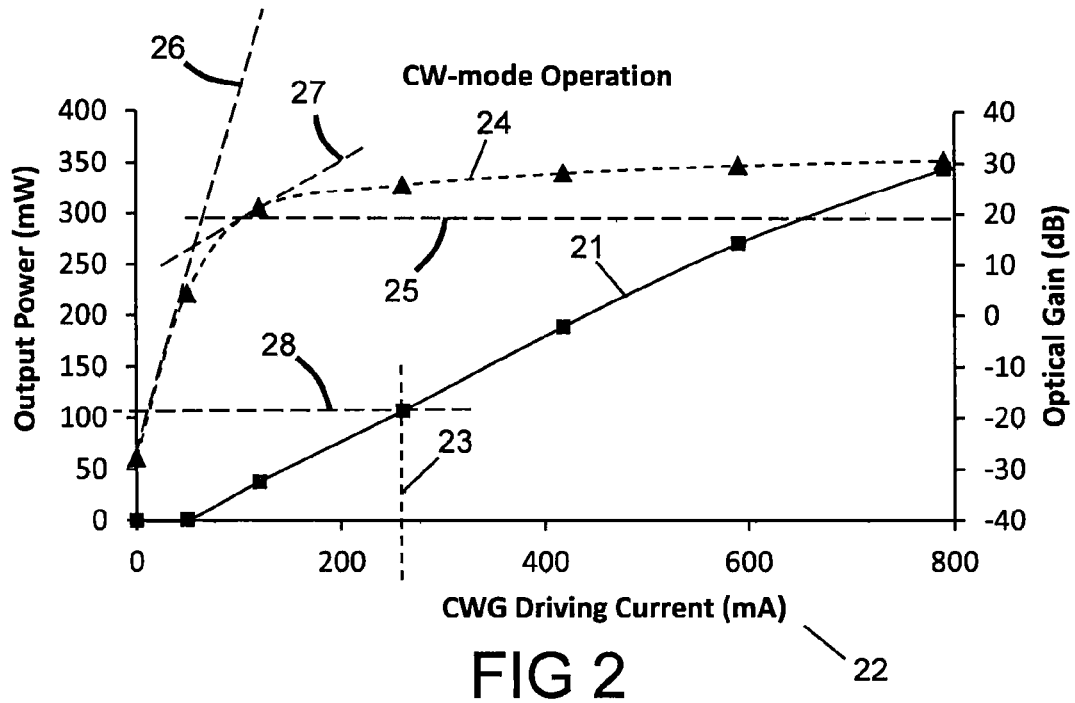
FIG. 2 shows a characteristic of the first semiconductor amplifier.

The first semiconductor amplifier 3 can be defined by an optical lasing threshold 28, shown in FIG. 2, in the absence of the input optical radiation 14. The controller 4 can be configured to cause the waveguide 6 of the first semiconductor amplifier 3 to emit an output signal 102 having an output power 21 greater than the optical lasing threshold 28 when the input optical radiation 14 is present. Preferably the controller 4 can be configured to cause the waveguide 6 of the first semiconductor amplifier 3 to emit the output signal 102 having the output power 21 at least two times greater than the optical lasing threshold 28 when the input optical radiation 14 is present. More preferably the controller 4 can be configured to cause the waveguide 6 to emit the output signal 102 having an output power 21 at least three times greater than the optical lasing threshold 28 when the input optical radiation 14 is present.

The controller 4 and the first semiconductor amplifier 3 may be such that the first semiconductor amplifier 3 is prevented from lasing by the presence of the input optical radiation 14.

The ability to operate the first semiconductor amplifier 3 at power levels that exceed its optical lasing threshold 28 allows significant increases in the achievable output powers of the output radiation 15 without incurring the limitations caused by non-linear effects such as, for example, stimulated Brillouin scattering, stimulated Raman scattering, and four-wave mixing. The first semiconductor amplifier 3, when operated in saturation, can reduce the small signal amplitude noise present in the input optical radiation 14 thereby improving the signal to noise ratio. In addition, the first semiconductor amplifier 3 replicates the spectral properties of the input optical radiation 14. Reducing the noise amplitude of the optical radiation 102 entering into the preamplifier 61 and thus the power amplifier 62 reduces the amount of non-linear effects such as stimulated Raman scattering. It therefore permits the amplitude and power of the optical radiation 102 to be increased before non-linear effects in the preamplifier 61 and the power amplifier 62 become problematic. For optical fibre laser systems, its inclusion therefore allows an increase in amplification without requiring an additional optical fibre amplification stage.

Surprisingly, it is possible to operate the first semiconductor amplifier 3 at intensity levels that would normally cause it to be unstable or lase. This is a surprising result that enables the optical power of the optical radiation 15 emitted by the apparatus to be increased before non-linear effects become problematic, and thus enabling much higher output powers to be achieved with less amplifying stages. This provides advantages in output power, cost, power consumption, and simplicity.

The controller 4 may be configured to control an optical gain 24 of the first semiconductor amplifier 3 such that the optical gain 24 is reduced in the absence of the input optical radiation 14 thereby preventing the first semiconductor amplifier 3 from lasing. The optical gain 24 is reduced by reducing the drive current 22. Advantageously, reducing the optical gain 24 in the absence of the input optical radiation 14 can be used to prevent catastrophic failure of the laser system when the input optical radiation 14 is not present.

The apparatus 100 may include the optical source 1 for providing the input optical radiation 14. The optical source 1 is shown connected to the optical input 13.

Reflections 107 from the apparatus 100 back into the first semiconductor amplifier 3 can cause the first semiconductor amplifier 3 to lase, which can lead to self Q-switching and catastrophic damage. FIG. 1 shows a reflection 107 from the isolator 11. Reflections can also occur from the coupler 2, the preamplifier 61, and other components within the apparatus 100. Reflections can be reduced by the use of optical isolators, optical circulators, angled cleaves on optical components, and anti-reflection coatings. The optical source 1 can be selected such that the input optical radiation 14 when present has a power greater than a power of the reflections 107 when the input optical radiation 14 is not present. Preferably the input optical radiation 14 when present has a power entering the first semiconductor amplifier 3 that is greater than the maximum total power of the reflections 107 entering into the first semiconductor amplifier 3 when the input optical radiation 14 is not present.

The apparatus 100 can be provided with or without the optical source 1.

The first semiconductor amplifier 3 is preferably a superluminescent diode.

The waveguide 6 is preferably a curved waveguide semiconductor diode. This allows the attainment of higher power in the optical radiation 15 emitted by the apparatus 100.

FIG. 1 shows the input optical radiation 14 being provided by an optical source 1. The optical source 1 may be a superluminescent diode which may comprise a curved waveguide semiconductor diode. Configuring both the optical source 1 and the first semiconductor amplifier 3 to be superluminescent diodes, allows the first semiconductor amplifier 3 to be operated at output powers greater than two, and preferably greater than three times its optical lasing threshold 28 shown with reference to FIG. 2. This has great advantages in the design of master oscillator power amplifier systems used in marking, cutting, and welding because it allows higher output powers to be achieved before non-linear effects become problematic.

The waveguide 6 preferably has a high reflecting facet 7 which can be integral to the waveguide 6, or can be provided by an external reflector which may be a mirror on the end of an optical fibre.

The low reflecting facet 8 can have a reflectivity less than 0.1%, and preferably less than 0.01%. Low reflectance is important in order to prevent spurious lasing of the first semiconductor optical amplifier 3.

The optical source 1, the coupler 2, and the first semiconductor amplifier 3 can be connected using optical fibre. The optical fibre is preferably polarization maintaining optical fibre.

The first semiconductor amplifier 3 when seeded by the optical source 1 is an ideal seed for a master oscillator power amplifier system such as shown in FIG. 1. The preamplifier 61 and the power amplifier 62 are preferably optical fibre amplifiers. The optical fibre amplifiers preferably comprise rare-earth doped optical fibre.

The preamplifier 61 can be a rare-earth doped optical fibre amplifier, which may be core pumped and/or cladding pumped.

The power amplifier 62 can be a rare-earth doped optical fibre amplifier, which may be core pumped and/or side pumped. The power amplifier 62 is preferably cladding pumped.

The power amplifier 62 can comprise an optical fibre amplifier. Alternatively or additionally, the power amplifier 62 can comprise a free-space solid state amplifier such as a rod amplifier or a slab amplifier, for example an AMPHOS 100 from AMPHOS GmbH from Herzogenrath, Germany. A free-space solid state amplifier allows higher peak powers to be achieved prior to the onset of non-linear effects compared to a rare-earth doped optical fibre amplifier.

A mid-stage optical isolator 63 is preferably provided between the preamplifier 61 and the power amplifier 62. The mid stage optical isolator 63 may comprise an optical filter to filter amplified spontaneous emission between the preamplifier 61 and the power amplifier 62.

A coupler 64 can be provided between the preamplifier 61 and the power amplifier 62 which is connected to a visible light source 65. The visible light source 65 can be a laser diode, a superluminescent diode, or a light emitting diode. The visible light source 65 is useful for alignment purposes, for example, when setting up laser marking, laser welding, or laser cutting systems. The visible light source 65 preferably has a wavelength of between 500 nm and 670 nm, and more preferably between 600 nm and 670 nm. The coupler 64 is preferably a wavelength division multiplexer connected to the visible light source 65 and the preamplifier 61 at its inputs, and the power amplifier 62 at its output. The mid-stage isolator 63, if present, is preferably located between the preamplifier 61 and the coupler 64.

The power amplifier 62 can be a single mode power amplifier, or a multimode power amplifier.

A problem that arises with multimode power amplifiers is beam instabilities caused by optical speckle. The guided optical modes within the power amplifier 62 are not launched equally, and this causes temporal instabilities and may cause self Q-switching of the power amplifier 62. This problem can be resolved by selecting the optical source 1 to be a broadband source having an optical bandwidth 16 greater than 1 nm, configuring the first semiconductor amplifier 3 to amplify the input radiation 14, and providing an optical mode mixer 66 at the input of the power amplifier 62. The optical source 1 and the first semiconductor amplifier 3 are preferably superluminescent diodes. The optical source 1 and the first semiconductor amplifier 3 preferably comprise curved waveguides 6. The optical mode mixer 66 can be a long period grating, an offset splice, an optical fibre configured to have variable bend radii along its length, or an optical fibre comprising scattering or microbending elements along its length. The inclusion of the optical mode mixer 66 is preferred because it reduces spatial and temporal instabilities in the power amplifier, thus reducing pointing instabilities in material processing applications such as cutting, welding, marking, and additive manufacturing.

An optional depolariser 67 is provided at the input of the preamplifier 61. The depolariser 67 depolarises the output signal 102 emitted from the first semiconductor amplifier 3. This has advantages in fibre laser systems because: (i) it reduces optical non-linearities such as stimulated Raman scattering and stimulated Brillouin scattering thus allowing high peak and average powers of the output radiation 15 to be achieved, (ii) it reduces cost by avoiding the need for polarization maintaining optical fibre within the preamplifier 61 and the power amplifier 62, and (iii) it provides defined polarisation output properties of the optical radiation 15 which is important for material processing applications such as marking, cutting, welding, and drilling. The depolariser 67 can comprise a Lyot depolariser comprising two wave plates with their fast axes 45° apart, and with the second plate twice thicker than the first. The wave plates can be lengths of polarisation maintaining fibre.

If the optional depolariser 67 is not included, the preamplifier 61 and the power amplifier 62 can comprise polarization maintaining optical fibre.

An output beam optic 68 is shown at the output of the output fibre 5. The output beam optic 68 can comprise at least one of: an isolator; a collimating lens system; an anti-reflection coating; an optical detector for detecting optical radiation emitted from a work piece, which detector can be used for process monitoring and/or back reflection detection; and a source of visible optical radiation for optical alignment purposes.

FIG. 2 shows the optical power characteristic measured at the output of the coupler 2 when both the optical source 1 and the first semiconductor amplifier 3 of FIG. 1 were superluminescent diodes. The coupler 2 was a three-port optical circulator as shown in FIG. 1. The superluminescent diodes were curved waveguide semiconductor diodes model number LC96A1060CWG-20R supplied by II-VI Incorporated of Saxonburg, Pa., USA. The output power 21 of the output signal 102 from the first semiconductor amplifier 3 increases with increasing drive current 22. The drive current 22 can be delivered by the driver 12 for the first semiconductor amplifier 3 as shown in FIG. 1. Also shown is the optical gain 24 of the first semiconductor amplifier 3 in the double pass configuration of FIG. 1. The optical power being injected into the low reflectivity end 8 of the waveguide 6 was 300 µW. As shown in FIG. 2, it was possible to emit optical radiation from the coupler 2 with output powers 21 as high as 300 mW into the preamplifier 61. This is far in excess of what would be achievable without injecting the input optical radiation 14 from the optical source 1. When operated as a standalone device, the first semiconductor amplifier 3 had a lasing threshold 23 of approximately 240 mA corresponding to an optical lasing threshold 28 of approximately 100 mW. The optical lasing threshold 28 of 100 mW may have been due to external reflections 107, such as, for example, from the isolator 11, the coupler 2 or splices between fibres.

The first semiconductor amplifier 3 is being operated in a double pass configuration, which increases the amount of optical gain 24 provided by the waveguide 6. Increasing the amount of optical gain increases the range of powers of the input optical radiation 14 in which the first semiconductor amplifier 3 is in saturation. For a fixed power of the input optical radiation 14, the double pass configuration also increases the range of the driving current 22 in which the first semiconductor amplifier 3 is in saturation. The first semiconductor amplifier 3 can be considered to be in saturation when an input optical signal will undergo a smaller optical gain in comparison with a weaker input optical signal. Referring to FIG. 2, the first semiconductor amplifier 3 is in saturation at optical gains 24 greater than the saturated optical gain 25. The saturated optical gain 25 can be considered to have occurred when the gain slope 27 of the optical gain 24 with respect to the drive current 22 has reduced to 50% of the initial gain slope 26 of the optical gain 24 with respect to the drive current 22. The initial gain slope 26 is where the driving current 22 is zero. The importance of operating the first semiconductor amplifier 3 in saturation is that output noise is compressed. The signal to noise ratio is therefore improved. For a given relative amplitude fluctuation in the input optical radiation 14, the output optical radiation 15 will have a smaller relative amplitude fluctuation when the first semiconductor amplifier 3 is operated in saturation than when it is operated in its linear regime. All input fluctuations, signal or noise, are replicated proportionally with optical gain.

Figure 3:
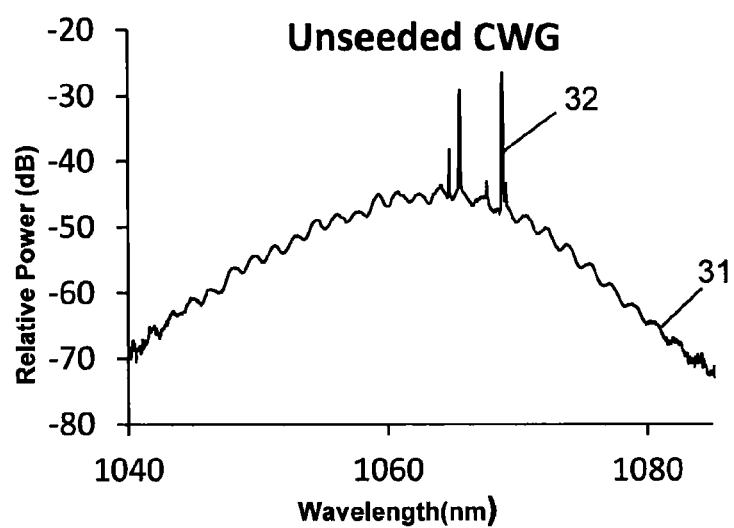
FIG. 3 shows the output spectra of a superluminescent diode when unseeded.

In an experiment described with reference to FIGS. 3 and 4, both the first semiconductor amplifier 3 and the optical source 1 were the superluminescent diode described with reference to FIG. 2. FIG. 3 shows the optical spectrum 31 of the first semiconductor amplifier 3 measured at the output of the coupler 2 when the optical source 1 was turned off. Spurious lasing signals 32 were observed in the output spectrum 31 at power levels of approximately 100 mW, corresponding to the optical lasing threshold 28 in FIG. 2. Spurious lasing operation can cause stimulated Brillouin scattering in the preamplifier 61 and the power amplifier 62, which can result in self Q-switching leading to permanent damage of the apparatus 100.

Figure 4:
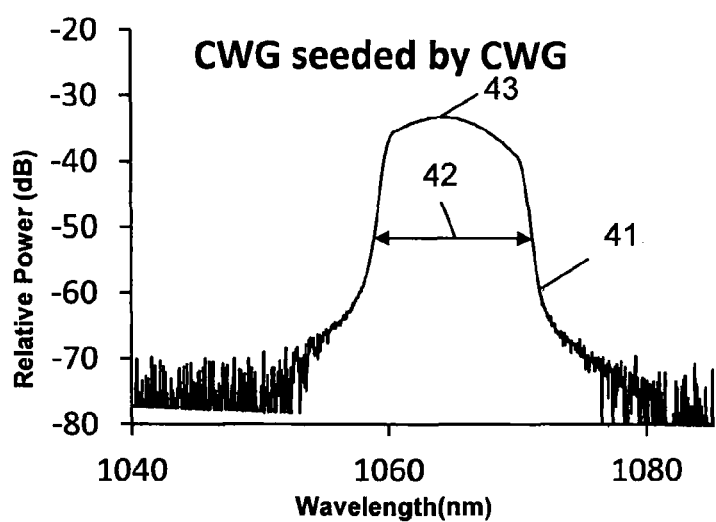
FIG. 4 shows the output spectra of the superluminescent diode when seeded by a second superluminescent diode.

FIG. 4 shows the optical spectrum 41 of the first semiconductor amplifier 3 measured at the output of the coupler 2 when the optical source 1 was turned on. An optical filter 9 was provided, as shown in FIG. 1, in order to limit the optical bandwidth 16. The optical filter 9 was a thin film filter having a bandwidth 16 of approximately 10 nm. No spurious lasing signals were observed in the output spectrum 41 at an output power of 300 mW. The output spectrum 41 had a passband 42 of approximately 10 nm measured 20 dB down from its maximum 43.

Figure 5:
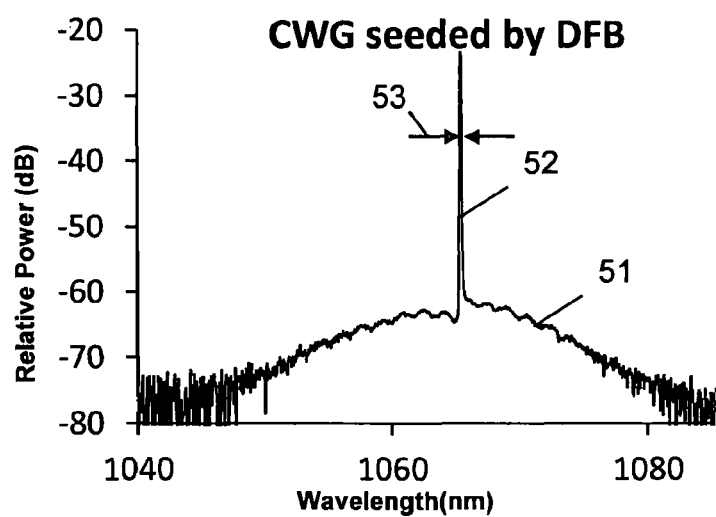
FIG. 5 shows the output spectra of the superluminescent diode when seeded by a distributed feedback semiconductor laser diode.

FIG. 5 shows the optical spectrum 51 of the first semiconductor amplifier 3, which was the superluminescent diode described with reference to FIG. 2, obtained when the optical source 1 was a distributed feedback laser diode. The output spectrum 51 comprises an amplified signal 52 which is an amplified version of the spectrum output by the optical source 1. The linewidth 53 was measured to be the same as the linewidth of the optical source 1.

Referring to FIGS. 1, 2 and 4, configuring the optical source 1 to be a superluminescent diode, and using the superluminescent diode to seed the first semiconductor amplifier 3 allowed the first semiconductor amplifier 3 to be operated at output powers 21 greater than two, and preferably greater than three times its optical lasing threshold 28. This is a surprising result that enables the optical power of the optical radiation 15 to be increased without requiring an additional optical-fibre amplification stage. Without intending to limit the scope of the invention, it is believed that this is because the first semiconductor amplifier 3 is being operated in saturation with respect to the input optical radiation 14, and thus has a lower small signal gain than when the input optical radiation 14 is not present. Therefore the optical lasing threshold 28 of the first semiconductor amplifier 3 is increased, allowing output powers 21 greater than the optical lasing threshold 28 to be achieved.

The optical source 1 may be selected such that the input optical radiation 14 has a power greater than a power of reflections 107 from the apparatus 100 that cause the first semiconductor amplifier 3 to lase when the input optical radiation 14 is not present. Preferably the power of the input optical radiation 14 is much greater than the power of reflections (not shown) that make the first semiconductor amplifier 3 lase at the optical lasing threshold 28.

Operating the first semiconductor amplifier 3 in saturation causes amplitude fluctuations of the input optical radiation 14 to experience a lower optical gain than the large signal gain. Amplitude fluctuations of the output signal 102 from the first semiconductor amplifier 3 are therefore compressed, that is, they have a smaller relative amplitude compared to the average output power of the output signal 102 than for the input optical radiation 14; the signal to noise ratio is improved. The amplitude fluctuations of the output signal 102 are amplified by the preamplifier 61 and the power amplifier 62, which amplification can cause non-linear effects such as stimulated Raman scattering, stimulated Brillouin scattering, and four wave mixing thus limiting the achievable output power of the optical radiation 15. The non-linear effects can also convert the wavelength of the optical radiation 15 to wavelengths outside the operating wavelength specification of the output optics 68. The non-linear effects can also transfer optical radiation propagating through the preamplifier 61, power amplifier 62 and the output fibre 5 into different optical modes, reduces output power, reduces beam quality, and causes spatial instabilities in the optical radiation 15. Such spatial instabilities cause pointing errors in industrial material processing applications such as marking, cutting, and welding. The inclusion of the first semiconductor amplifier 3 that is operated in saturation, not only reduces the amplitude of the relative amplitude fluctuations of the output signal 102, but also avoids an additional optical-fibre amplification stage to be added. An additional optical-fibre amplification stage would increase the total length of optical fibre used in the apparatus 100, would increase non-linear effects, and thus limit the achievable maximum output power of the optical radiation 15.

Referring to FIGS. 1 to 5, light generated by spontaneous emission within the waveguide 6 will be amplified as it propagates along the waveguide 6 to the high reflecting facet 7. The light will then be reflected and amplified a second time as it propagates back along the waveguide 6 to the low reflecting facet 8. The low reflecting facet 8 preferably has a reflectivity less than 0.1%, and preferably less than 0.01%, in order to suppress back reflection and thus help to prevent lasing. The low reflecting facet 8 can have an anti-reflection coating. Alternatively or additionally, the low reflecting facet 8 can be angled with respect to the waveguide 6 such that back reflection into the waveguide 6 is reduced. Angles of at least 1 degree can be used.

The high reflecting facet 7 can have a reflectivity greater than 50%, preferably greater than 80%, and more preferably greater than 90%. This can be achieved with a multilayer coating or by a reflector that is attached to the waveguide 6.

The first semiconductor amplifier 3 can be defined by an optical gain 19 characterized by a gain bandwidth 18 of at least 10 nm at 20 degrees Celsius. The gain bandwidth 18 is preferably at least 20 nm. The gain bandwidth 18 is more preferably greater than 30 nm. Having a broad gain bandwidth 18 enables amplification of input signals having broad input spectra. It also reduces the need for temperature controlling, for example, with Peltier coolers. The gain bandwidth 18 will have substantially the same value as the amplified spontaneous emission (ASE) bandwidth of the first semiconductor amplifier 3.

Semiconductor waveguide diodes that are designed to have a single transverse mode, tend to support higher-order transverse modes when the waveguide is pumped with high injection currents. This is because of refractive index changes that arise from heating and injection of charge carriers. As shown with reference to FIG. 1, it is preferred that the first semiconductor amplifier 3 has a means 101 to remove such higher order modes. Such a means 101 is provided by the curvature of the waveguide 6 in a curved waveguide semiconductor diode.

The above desirable features for the first semiconductor amplifier 3 can be provided by a curved waveguide semiconductor diode such as shown in FIG. 1. The curvature in the waveguide 6 results in a non-perpendicular angle with the low reflecting facet 8, thus reducing the amount of reflected light back into the waveguide 6. This can be reduced further with anti-reflection coatings. The curvature of the waveguide 6 increases losses for the higher order transverse modes that exist at higher injection currents due to refractive index changes that arise from heating and injection of carriers. Preferably the waveguide 6 is designed to minimize bend losses for the fundamental mode.

Referring to FIG. 1, the optical filter 9 has a transmission 17 characterized by a peak wavelength 104 and an optical bandwidth 16. The optical bandwidth 16 is preferably less than the gain bandwidth 18 of the first semiconductor amplifier 3. The optical bandwidth 16 can be less than 20 nm, preferably less than 15 nm, and more preferably less than 10 nm. The optical bandwidth 16 is preferably greater than 1 nm.

Referring again to FIG. 1, the controller 4 preferably controls the optical source 1 and the first semiconductor amplifier 3 in synchronism with each other. Preferably, the controller 4 turns the optical source 1 on before the first semiconductor amplifier 3. The controller 4 can also be connected to at least one of the preamplifier 61 and the power amplifier 62. At least one of the preamplifier 61 and the power amplifier 62 can be controlled in synchronism with the first semiconductor amplifier 3, and can be turned on before the controller 4 turns the first semiconductor amplifier 3 on. This can be advantageous in order to improve the turn on characteristics of the optical radiation 15, such as rise time and pulse to pulse variation of output pulses. At least one of the preamplifier 61 and the power amplifier 62 can be turned off at the same time or after the first semiconductor amplifier 3 is turned off. By turned off, it is meant either turning off completely, or reducing the gain of at least one of the preamplifier 61 and the power amplifier 62 such that amplified spontaneous emission is reduced. The latter can be advantageous in order to reduce amplified spontaneous emission between pulse outputs.

The apparatus shown in FIG. 1 has an optical filter 9 between the optical source 1 and the first semiconductor amplifier 3. The optical filter 9 can be an etalon filter, a fibre Bragg grating, a thin film filter, or any other suitable type of optical filter. The optical filter 9 can be tuneable. The optical filter 9 can be an acoustic-optically tuneable filter. The optical filter 9 is selected to reduce the optical bandwidth of the optical source 1 in order to optimize the performance of the apparatus. Thus for example, in a pulsed fibre laser, the optical filter 9 can have a bandwidth of 10 nm in order to reduce the likelihood of stimulated Brillouin scattering and/or stimulated Raman scattering.

The apparatus 100 includes an optical isolator 10 in order to protect the optical source 1 from feedback.

The coupler 2 can be a fused taper coupler or a power splitter. Preferably the coupler 2 is an optical circulator in order to reduce optical losses and to provide additional optical isolation.

The apparatus 100 is shown with an optical isolator 11 at the output of the coupler 2. Advantageously, the optical isolator 11 helps to prevent backreflected light from entering the first semiconductor amplifier 3. If the optical isolator 11 is omitted, the backreflected light can cause instability within the first semiconductor amplifier 3, and the back reflected light may cause the first semiconductor amplifier 3 to lase.

The optical source 1 may be a semiconductor diode such as, for example, a Fabry Perot laser, a distributed feedback semiconductor laser, a superluminescent diode, or a curved waveguide semiconductor diode.

The optical source 1 can be a continuous wave laser such as, for example, a semiconductor laser, a disk laser, or a yttrium aluminium garnet rod laser.

The optical source 1 can be a fibre laser, a source of amplified spontaneous emission radiation which preferably comprises a rare-earth doped optical fibre, or a random fibre laser. The random fibre laser can comprise a half open cavity comprising 100 m or more of passive optical fibre connected to an active optical fibre having an optical reflector at its output end. Such an arrangement is described in IEEE Journal of Selected Topics in Quantum Electronics, Volume 21(1), pages 10-15, 2015.

A problem that can occur with the apparatus 100 of FIG. 1 is that in the absence of the input optical radiation 14, the first semiconductor amplifier 3 can lase. This can result in non-linear effects arising in the preamplifier 61, power amplifier 62 and the optical fibre 5 such as stimulated Brillouin scattering. Stimulated Brillouin scattering can cause self Q-switching, and/or catastrophic failure of the apparatus 100.

Figure 6:
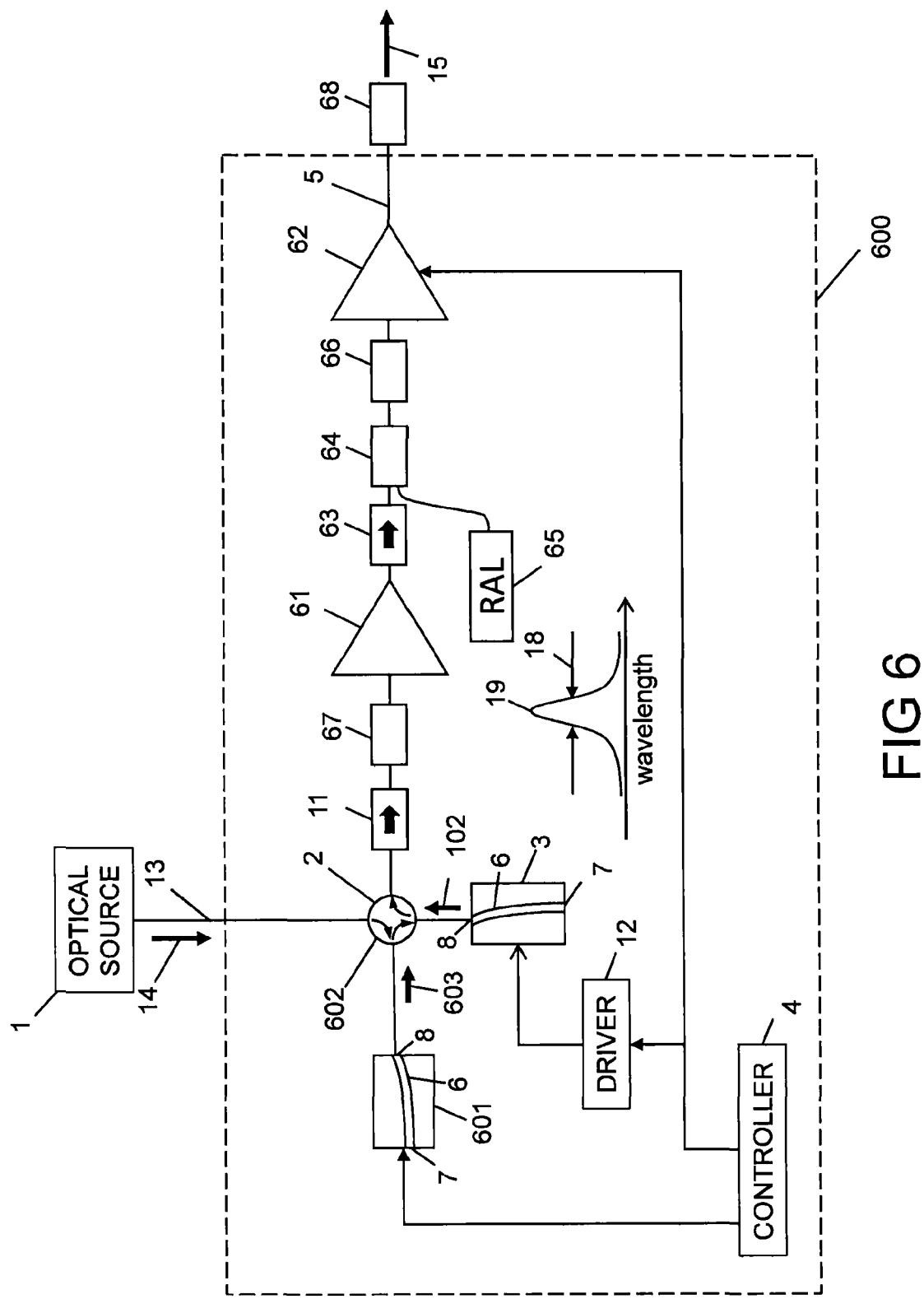
FIG. 6 shows an apparatus comprising a first and a second semiconductor amplifier.

FIG. 6 shows an apparatus 600 comprising a second semiconductor amplifier 601. The second semiconductor amplifier 601 is preferably operated in a double pass configuration as shown in FIG. 6. The second semiconductor amplifier 601 can be a superluminescent diode which preferably comprises a curved waveguide 6. The optical source 1 is coupled into the first semiconductor amplifier 3 via the coupler 2 and the second semiconductor amplifier 601. The coupler 2 is shown as a four port circulator 602. The optical source 1 may be an external optical source provided by a user which may not form part of the apparatus 600. The optical source 1 may emit more than one wavelength within the gain bandwidth 18 of the first semiconductor amplifier 3.

The controller 4 can be such that it energizes the second optical amplifier 601 when the power amplifier 62 is turned on. The output power 603 from the second semiconductor amplifier 601 in the absence of the input optical radiation 14 is preferably less than its optical lasing threshold 28 shown with reference to FIG. 2. The inclusion of the second semiconductor amplifier 601 enables the input optical radiation 14 to be amplified by both the first semiconductor amplifier 3 and the second semiconductor amplifier 601.

Advantageously, the input optical radiation 14 has sufficient optical power that the controller 4 is able to cause the waveguide 6 of the second semiconductor amplifier 601 to operate in saturation, thus enabling a reduction of at least one of the spectral noise and the temporal noise of the input optical radiation 14. Preferably, the controller 4 causes the second semiconductor optical amplifier 601 to emit the optical radiation 603 in the absence of the input optical radiation 14, thereby ensuring that the first semiconductor amplifier 3 does not lase, and thus avoiding self Q-switching, and/or catastrophic failure of the apparatus 600.

Figure 7:
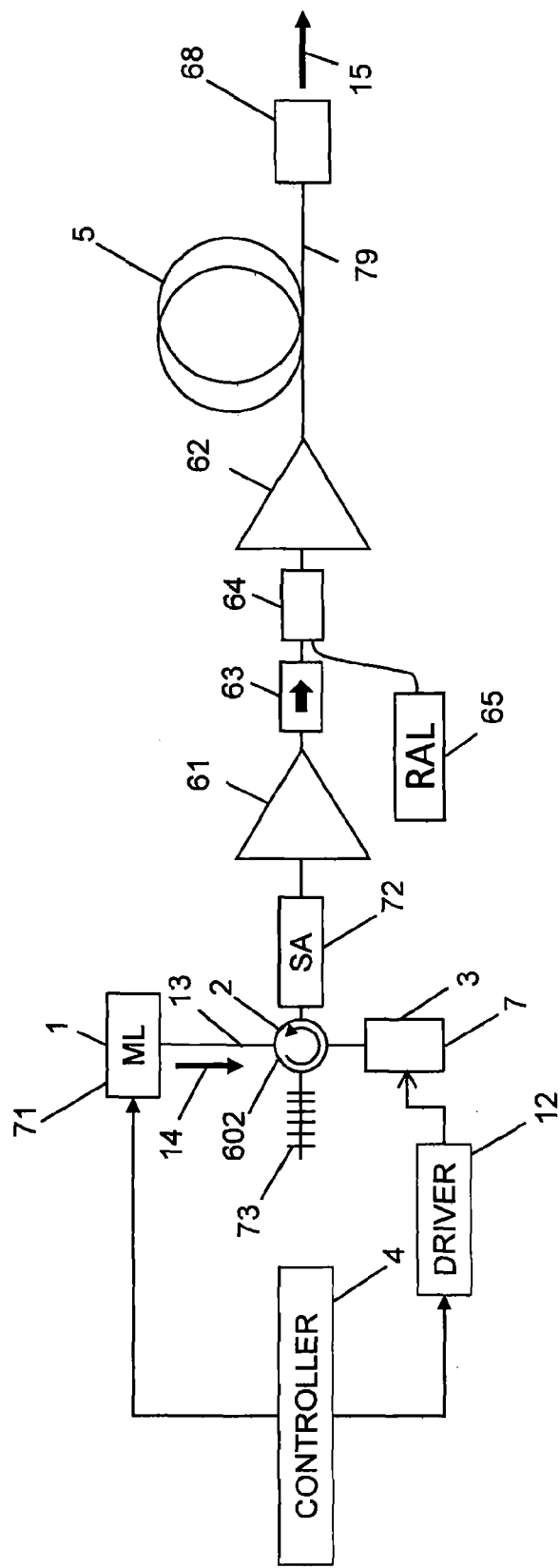
FIG. 7 shows the first semiconductor amplifier used to pulse pick the output from a mode locked laser.

The optical source 1 can be a mode locked laser 71 as shown in FIG. 7. The input optical radiation 14 is coupled into the first semiconductor amplifier 3 via the coupler 2 and into the preamplifier 61. Referring to FIG. 8, the mode locked laser 71 emits a train of optical pulses 74 having a pulse repetition frequency 78. The controller 4 can down-select the optical pulses 74 by operating the first semiconductor amplifier 3 at a pulse repetition rate that is lower than the pulse repetition frequency 78 to provide the optical pulses 75 shown in FIGS. 9 and 10. As shown in FIG. 11, the controller 4 can also control the first semiconductor amplifier 3 such that it outputs bursts of at least two consecutive pulses 76. The optical pulses 74 that have been gated out are shown by the dashed curves in FIGS. 9 to 11. The down-selection of the optical pulses 74 is referred to as pulse picking.

The first semiconductor amplifier 3 should be operated at peak power levels less than its damage threshold. In the event that the optical pulses 74 have a peak power 77 greater than or approaching the damage threshold of the first semiconductor amplifier 3, a chirped grating 73 can be provided in order to temporally stretch the optical pulses 74 before they enter the first semiconductor amplifier 3. The chirped grating 73 can be a chirped fibre Bragg grating, or an external bulk optics grating. The chirped grating 73 is incorporated into the apparatus 600 in FIG. 7 using the four-port circulator 602. The provision of the chirped grating 73 is referred to as chirped pulse amplification. The optical pulses 74 can be recompressed by a dispersive element (not shown) having an opposite dispersion. The dispersive element can be provided by the optical fibre 5, the pre-amplifier 61, the power amplifier 62, or by an external device such as a pulse compressor.

An optional saturable absorber 72 is shown prior to the preamplifier 61 to filter out optical noise that can occur between the optical pulses 75. The saturable absorber 72 can be a semiconductor saturable absorber such as an SA-1064-14-500fs-FC/APC saturable absorber supplied by Batop GmbH of Jena, Germany. Alternatively, the saturable absorber 72 may comprise a quantum well microcavity, graphene, carbon nanotubes, or may be an optical fibre doped with a rare earth or a semiconductor. The saturable absorber 72 can also be used in the apparatus shown in FIGS. 1 and 6.

The first semiconductor amplifier 3 reduces amplitude noise such as pulse to pulse amplitude variation in the output radiation 15. This is achieved by operating the first semiconductor amplifier 3 in saturation as described with reference to FIGS. 1 and 2. It should be noted that the first semiconductor amplifier 3 may not reduce amplitude noise between the optical pulses 75 because the first semiconductor amplifier 3 may not be in saturation, and may also emit amplified spontaneous emission. Combining the noise reduction properties of the first semiconductor amplifier 3 while in saturation with the noise reduction properties of the saturable absorber 72 provides significant noise reduction advantages over the prior art, particularly when the optical radiation 15 is defined by output pulses 75 having peak powers greater than 1 kW, or average powers greater than 1 W, preferably greater than 5 W, and more preferably greater than 10 W.

The mode locked laser 71 can a semiconductor mode locked laser, or a fibre mode locked laser. The mode locked laser 71 can be a picosecond mode-locked laser, or a femtosecond mode locked laser.

Use of the first semiconductor amplifier 3 as a pulse picker provides significant advantages over the prior art. These typically use electro-optic modulators for pulse picking the output of mode locked lasers having pulse repetition frequencies 78 greater than approximately 80 MHz, or acousto-optic modulators for pulse picking the output of mode locked lasers having pulse repetition frequencies 78 less than approximately 80 MHz. However electro-optic modulators are expensive and require complex electronic drivers, and acousto-optic modulators are limited in their high frequency operation and their electronic drivers consume large amounts of electrical power. In addition, neither the electro-optic modulators nor the acousto-optic modulators provide optical gain, and neither provide saturated optical gain that can improve signal amplitude noise. The bandwidth or operating speed of the first semiconductor amplifier 3 is typically very much greater than the bandwidth of acousto-optic modulators, and with appropriate drive electronics and packaging, can be similar to the bandwidth of electro-optic modulators.

FIG. 12 shows the output from an optical source 122 divided by a power splitter 121 and amplified by a plurality of independent preamplifiers 61 and power amplifiers 62. The power splitter 121 can comprise at least one optical fibre coupler or a planar waveguide. The apparatus shown in FIG. 12 takes advantage of the optical gain provided by the first semiconductor amplifier 3 which optical gain compensates at least in part for the losses caused by introducing the power splitter 121. The apparatus is shown having a plurality of the first semiconductor amplifiers 3 which can be operated independently, or driven from the same driver 12. Alternatively or additionally, a single first semiconductor amplifier 3 can be provided prior to the power splitter 121 using an arrangement such as shown in FIG. 7.

The optical source 122 can be the mode locked laser 71 as described with reference to FIG. 7. The arrangement shown in FIG. 12 has all the advantages of the arrangement of FIG. 7 but amortizes the cost of the mode locked laser 71 better. The chirped grating 73 and the four port circulator 602 described with reference to FIG. 7 can be used in the apparatus of FIG. 12. This is especially useful for femtosecond and picosecond lasers.

The optical source 122 can be a narrow linewidth laser such as, for example, the distributed feedback laser described with reference to FIG. 5. The narrow linewidth laser preferably has a linewidth 53 that is greater than the frequency shift of stimulated Brillouin scattering, which is approximately 10 GHz to 17 GHz in silica fibres at a wavelength of 1 micron. The optical radiation 15 emitted from the plurality of amplifier chains 123 can be combined together with a lens system (not shown) the apparatus being in the form of a coherently combined laser. Phase control of the amplifier chains 123 can be provided using the first semiconductor amplifiers 3, or additional modulators or electro-optic modulators (not shown), as further described with reference to U.S. Pat. No. 8,520,306 which is hereby incorporated herein.

Use of the first semiconductor amplifiers 3 in saturation allows the average power of each amplifier chain 123 to be balanced without introducing additional amplitude noise. In addition, if the output from the optical source 122 is interrupted, the first semiconductor amplifiers 3 will emit spontaneous emission, thereby protecting the power amplifier 62 from catastrophic failure.

Figure 13:
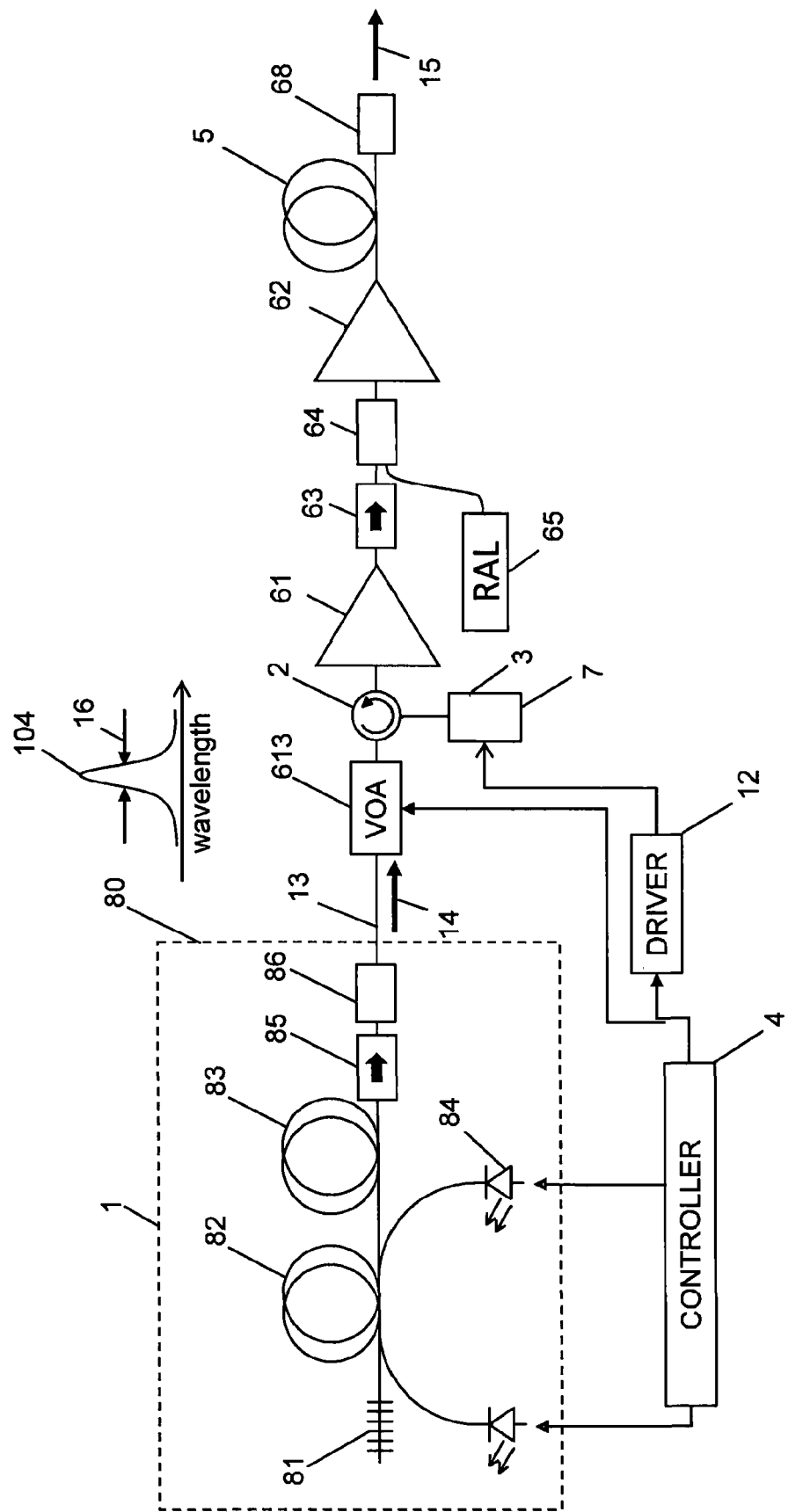
FIG. 13 shows a first semiconductor amplifier used to improve the noise properties of a random fibre laser.

The optical source 1 can be a random fibre laser 80 as shown in FIG. 13. The random fibre laser 80 is sometimes referred to as a random distributed feedback laser. The random fibre laser 80 comprises a reflector 81, an active fibre 82, a passive fibre 83, and pumps 84. The reflector 81 can be an optical fibre Bragg grating or a mirror. The reflector 81 can have a reflectivity greater than 4%, preferably greater than 10%, and more preferably greater than 20%. The active fibre 82 is preferably doped with a rare earth dopant, bismuth, or a transition metal. The pumps 84 are preferably semiconductor laser diodes which may be controlled by the controller 4. The active fibre 82 can be side pumped (as shown) or end pumped. The passive fibre 83 provides random Rayleigh scattering feedback thus defining an output coupler for an open laser cavity comprising the reflector 81, the active fibre 82 and the passive fibre 83. The passive fibre 83 has a length greater than 20 m, preferable greater than 100 m, and more preferably greater than 1 km. An optical isolator 85 to prevent external optical feedback, and a bandpass filter 86 to adjust the peak wavelength 104 and the bandwidth 16 of the input optical radiation 14 can be provided.

Figure 14:
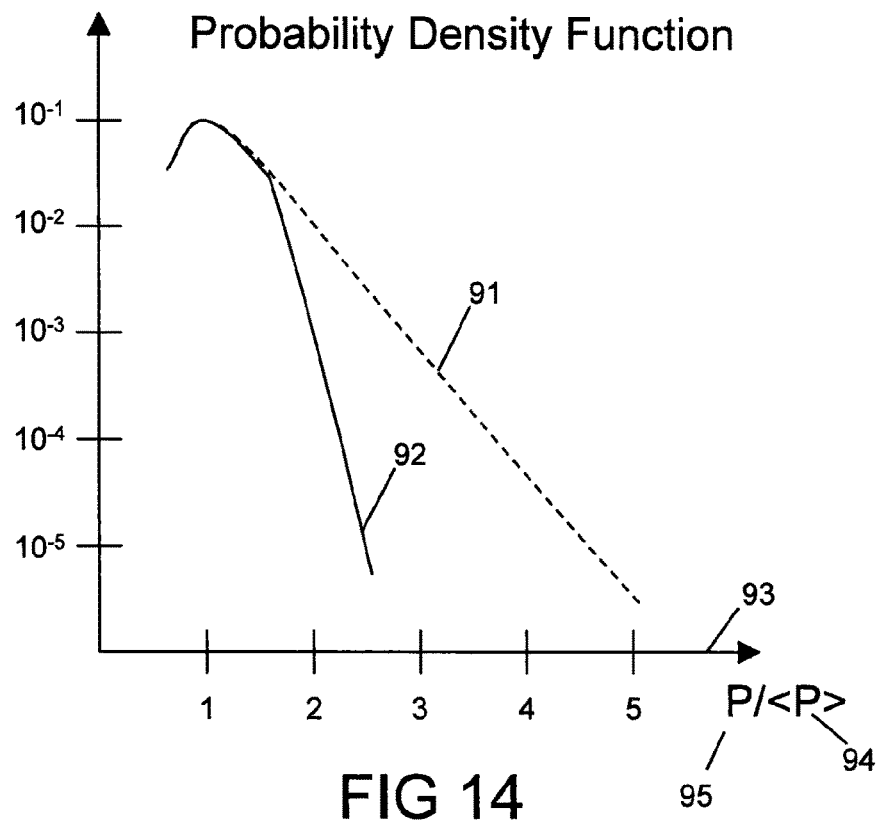
FIG. 14 shows the improvement in the probability density function of output radiation obtained using the first semiconductor amplifier.

FIG. 14 shows the probability density function 91 of the output radiation 15 when the first semiconductor amplifier 3 is not included, and the probability density function 92 of the output radiation 15 when the first semiconductor amplifier 3 is operated in saturation. The probability density functions 91, 92 are plotted against the normalized output power 93 (P/<P>) of the optical radiation 15, where the normalization is performed with respect to the average output power 94 <P> of the optical radiation 15. Surprisingly, the inclusion of the first semiconductor amplifier 3 has dramatically reduced the probability that the output optical radiation 15 has powers exceeding twice the average output power 94. This is significant because non-linear effects in the power amplifier 62 and the output fibre 5 are strongly dependent on the instantaneous output power 95 P. Non-linear effects such as stimulated Raman scattering, stimulated Brillouin scattering, and four wave mixing limit the achievable output power, and can convert the wavelength of the optical radiation 15 to wavelengths outside the operating wavelength specification of the output optics 68. Non-linear effects can also cause coupling to higher order modes that are lost in the output fibre 5, or degrade the beam pointing accuracy of the output optics 68. Operating the first semiconductor amplifier 3 in saturation, such as described with reference to FIGS. 1, 2, 6, 13 and 15, reduces spectral noise, temporal noise, and non-linear wavelength conversion, and is therefore highly advantageous.

FIG. 13 also shows an optical attenuator 613 that has been included prior to the first semiconductor amplifier 3. The optical attenuator 613 is preferably a variable optical attenuator. The controller 4 controls the variable optical attenuator such that the first semiconductor amplifier 3 is operated in saturation as described with reference to FIG. 2. Alternatively or additionally, the controller 4 controls the variable optical attenuator such that the first semiconductor amplifier 3 is operated below its damage threshold. The mode mixer 66 of FIG. 1 can also be provided.

Figure 15:
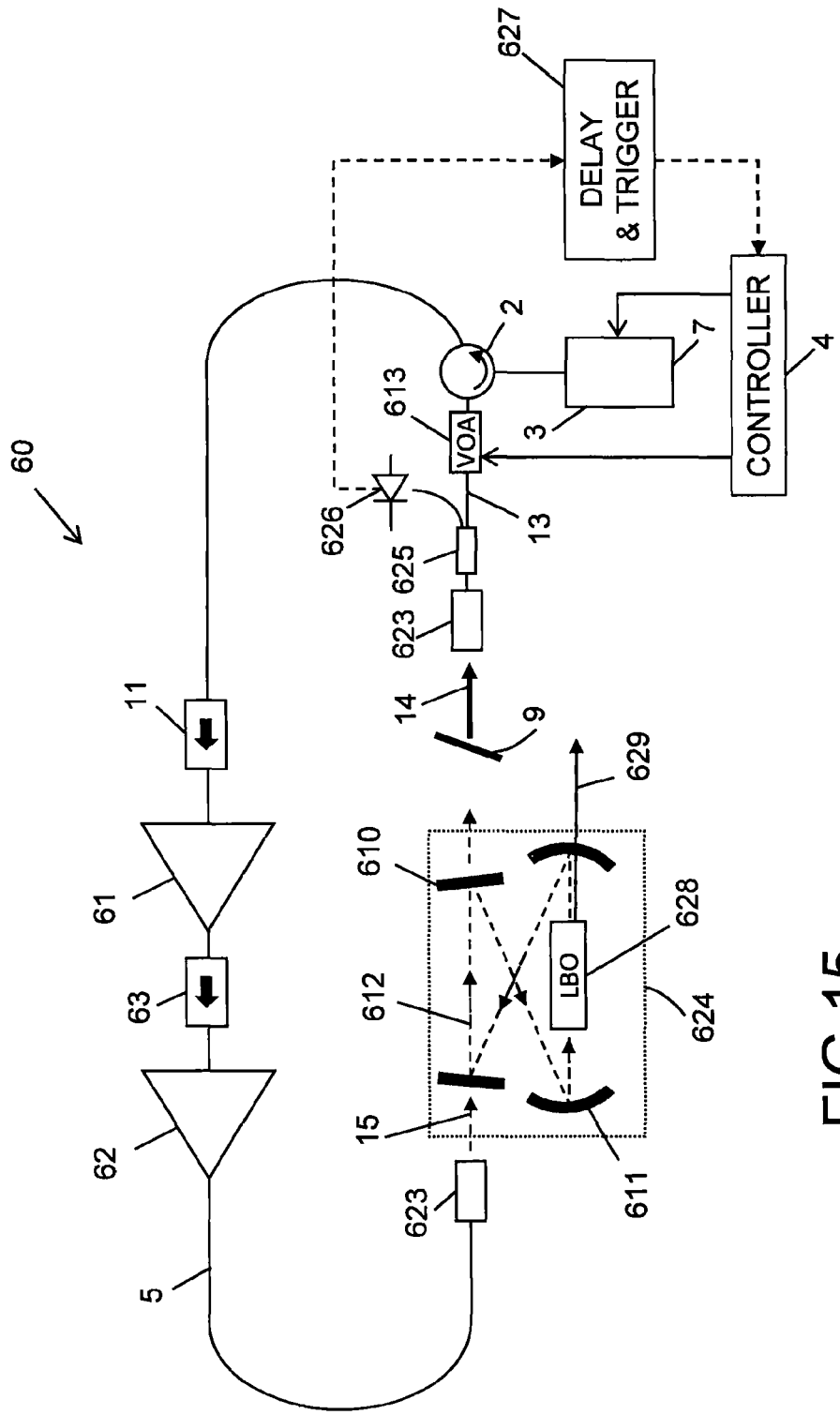
FIG. 15 shows a ring laser for frequency converting the optical radiation.

FIG. 15 shows a ring laser 60 comprising the preamplifier 61, the power amplifier 62 and the mid stage optical isolator 63. The optical radiation 15 from the output fibre 5 is coupled into a resonant cavity 624 via a lens 623. The lens 623 is preferably a collimator. The resonant cavity 624 comprises mirrors 610 and 611 and a non-linear crystal 628. The optical radiation 15 provided by the power amplifier 62 resonates in the resonant cavity 624 as infrared radiation 612, and is frequency converted by the non-linear crystal 628 to provide a frequency converted output radiation 629. If the preamplifier 61 and the power amplifier 62 are ytterbium doped optical amplifiers, the infrared radiation 612 can have a wavelength of approximately 1064 nm, and the frequency converted radiation 629 can have a wavelength of approximately 532 nm which is visible green light. Other wavelengths are also possible, for example, with at least one of ytterbium doping, erbium doping, neodymium doping, or using other rare earth metal dopants, semiconductor dopants, or bismuth dopants within the power amplifier 62.

The resonant cavity 624 also provides optical feedback in the form of the input optical radiation 14 which is coupled back to the power amplifier 62 via an optical filter 9 and lens 623. If the feedback is disturbed for any reason, the preamplifier 61 and the power amplifier 62 can be deprived of signal which can result in catastrophic failure. This problem is solved by the present invention by providing the first semiconductor amplifier 3 which in normal operation will amplify the feedback, and if the feedback is lost, will supply optical radiation to the preamplifier 61 to prevent the catastrophic failure. This is particularly advantageous when aligning the resonant cavity 624 and the lenses 623 because feedback is often lost during this process.

The optical isolator 11 can be included to prevent back reflections into the first semiconductor amplifier 3. Also shown is a coupler 625, a detector 626, and a detection circuit 627. The detection circuit 627 can comprise an electronic delay and an electronic trigger. The controller 4 can utilize the output from the detection circuit 627 to modulate the first semiconductor amplifier 3 in order to modulate the frequency converted radiation 629. Advantageously, the modulation can be tuned to the resonant frequency of the resonant cavity 624, or to a harmonic thereof.

FIG. 15 also shows an optical attenuator 613 that has been included prior to the first semiconductor amplifier 3. The optical attenuator 613 is preferably a variable optical attenuator. The controller 4 controls the variable optical attenuator such that the first semiconductor amplifier 3 is operated in saturation as described with reference to FIG. 2. Alternatively or additionally, the controller 4 controls the variable optical attenuator such that the first semiconductor amplifier 3 is operated below its damage threshold.

Advantageously, the controller 4 controls the first semiconductor amplifier 3 such that it is operated in saturation. The first semiconductor amplifier 3 replicates the spectral properties of the input optical radiation 14 and this helps in forming the feedback in order to operate the apparatus as a ring laser. As described with reference to FIGS. 13 and 14, this will reduce non-linear effects in the power amplifier 62 and the output fibre 5 that are strongly dependent on instantaneous optical power. Non-linear effects such as stimulated Raman scattering, stimulated Brillouin scattering, and four wave mixing limit the achievable output power, and can convert the wavelength of the optical radiation 15 to wavelengths outside the operating wavelength specification of the resonant cavity 624.

The resonant cavity 624 operates through non-linear optical effects that are highly dependent on the instantaneous optical power and instantaneous wavelength of the output radiation 15. Operating the first semiconductor amplifier 3 in saturation, as described with reference to FIG. 2, reduces the spectral noise, temporal noise, and non-linear wavelength conversion of the output radiation 15, which therefore results in a far more stable operation of the resonant cavity 624 and thus a lower noise and more stable frequency converted radiation 629. Operating the first semiconductor amplifier 3 in saturation is therefore highly advantageous.

The controller 4 can utilize the output from the detector 626 and the detection circuit 627 in order to detect for the absence of the input optical radiation 14 such that the controller 4 can reduce the optical gain 24 of the first semiconductor amplifier 3 in order to prevent it lasing. This is advantageous to prevent catastrophic damage of the preamplifier 61 and the power amplifier 62. The detector 626 and the detection circuit 627 can also be used in the apparatus of FIGS. 1, 6, 7, 12 and 13 to prevent catastrophic damage of the preamplifier 61 and the power amplifier 62.

Referring to FIGS. 1, 6, 7, 12, 13 and 15, the output fibre 5 can be single mode or multimode. The output fibre 5 can be a solid core fibre, a microstructured fibre, or a hollow core fibre. The hollow core fibre can be a Kagome fibre, a photonic crystal fibre, or an anti-resonant fibre. The output fibre 5 can be a polarization maintaining fibre.

Referring to FIGS. 1, 6, 7, 12, 13 and 15, the power amplifier 62 can be an optical fibre amplifier. Alternatively, the power amplifier 62 can be a free-space solid state amplifier such as a rod amplifier or a slab amplifier, for example an AMPHOS 100 from AMPHOS GmbH from Herzogenrath, Germany. This permits higher peak powers to be achieved compared to optical fibre amplifiers prior to the onset of non-linear effects, and can provide laser systems having better signal to noise ratios.

Figure 16:
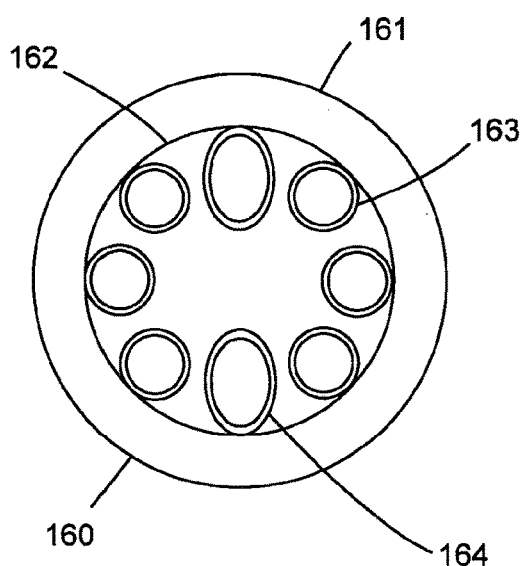
FIGS. 16 and 17 show cross sections of polarisation-maintaining hollow-core fibres.
Figure 17:
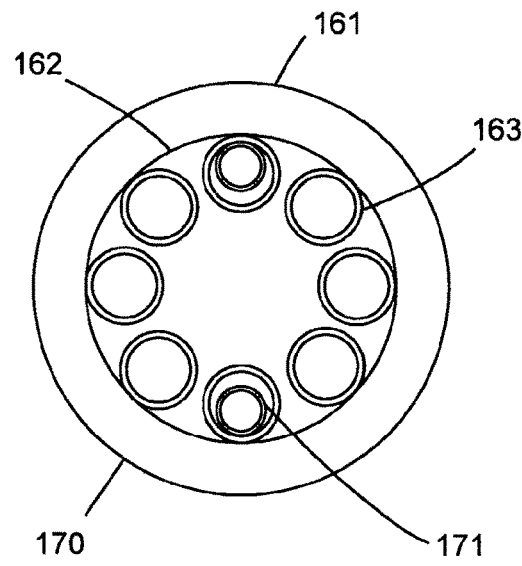

FIGS. 16 and 17 show anti-resonant fibres 160 and 170 comprising a capillary 161, and a plurality of anti-resonant tubes 163 around an inner surface 162 of the capillary 161. Advantageously, the anti-resonant fibres 160 and 170 are polarisation maintaining fibres having anti-resonant tubes 163 arranged to provide a two-fold rotational symmetry component in the fibre's cross section. This can be achieved by incorporating first and second anti-resonant tubes 164 and 171 in which the first anti-resonant tubes 164 are larger and/or of a different shape than the second anti-resonant tubes 163 as shown in FIG. 16. Alternatively or additionally the first anti-resonant tubes may be nested tubes 171 as shown in FIG. 17. The nested tubes 171 can be made of an absorbing or scattering material in order to create losses of one polarisation compared to the other polarisation of light propagating along the fibre 170. Use of polarisation maintaining fibres can be advantageous in material processing applications such as marking, cutting and welding because material processing performance is often dependent upon the polarisation of the incident optical radiation. The ability to transmit polarised optical radiation to the work piece, and to adjust the polarisation by rotating the optical fibre and/or polarisation optics such as half waveplates, is highly advantageous. This is particularly in the case of femtosecond and picosecond lasers described with reference to FIGS. 7 and 12 where the transmission through solid core fibres is challenging. The ability to transmit polarised optical radiation is also important in the apparatus of FIG. 15 because the frequency conversion process in the resonant cavity 624 is highly dependent upon the polarisation of the output optical radiation 15 input to the resonant cavity 624.

The invention described with reference to the Figures can be used in a variety of ways, including increasing the power obtainable from master oscillator power amplifiers, improving the signal to noise ratio of high power lasers, preventing optical damage of power amplifiers, and pulse picking in mode locked lasers, all of which can be achieved by a method which includes the step of operating the first semiconductor amplifier in saturation.

It is to be appreciated that the embodiments of the invention described above with reference to the accompanying drawings have been given by way of example only and that modifications and additional components may be provided to enhance performance. Individual components shown in the drawings are not limited to use in their drawings and they may be used in other drawings and in all aspects of the invention.

The invention claimed is:

1. Apparatus for providing optical radiation, which apparatus comprises an optical input, a coupler, a first semiconductor amplifier, a controller, a preamplifier, a power amplifier, an output fibre, and a resonant cavity, wherein:
   the optical input is for receiving input optical radiation;
   the optical input is connected in series to the coupler, the first semiconductor amplifier, the preamplifier, the power amplifier, the output fibre, and the resonant cavity;
   the resonant cavity comprises a non-linear crystal;
   the resonant cavity is connected to the optical input thereby forming a ring laser comprising the coupler, the first semiconductor amplifier, the preamplifier, the power amplifier, the output fibre, and the resonant cavity;
   the first semiconductor amplifier comprises a waveguide having a low reflecting facet;
   the first semiconductor amplifier is in a double pass configuration such that the low reflecting facet is connected to both the optical input and the preamplifier via the coupler;
   the controller is configured to cause the waveguide of the first semiconductor amplifier to operate in saturation thereby enabling the first semiconductor amplifier to reduce non-linear effects in the preamplifier, the power amplifier, and the output fibre;
   the resonant cavity operates to provide optical feedback in the form of the input optical radiation; and
   the first semiconductor amplifier is configured to supply optical radiation to the preamplifier in the event that the optical feedback is lost in order to prevent failure of the power amplifier.

2. Apparatus according to claim 1 wherein the controller and the first semiconductor amplifier are such that the first semiconductor amplifier lases in the absence of the input optical radiation, and the first semiconductor amplifier is prevented from lasing by the presence of the input optical radiation.

3. Apparatus according to claim 2 wherein the controller is configured to control an optical gain of the first semiconductor amplifier such that the optical gain is reduced in the absence of the input optical radiation thereby preventing the first semiconductor amplifier from lasing.

4. Apparatus according to claim 1 wherein the waveguide of the first semiconductor amplifier is a curved waveguide thereby allowing the attainment of higher powers in the optical radiation.

5. Apparatus according to claim 1 and including an optical attenuator located between the optical input and the coupler.

6. Apparatus according to claim 5 wherein the controller adjusts the optical attenuator such that the first semiconductor amplifier is operated in saturation.

7. Apparatus according to claim 1 and including an optical isolator between the preamplifier and the power amplifier.

8. Apparatus according to claim 1 and comprising an optical filter between the optical input and the first semiconductor amplifier.

9. Apparatus according to claim 1 and comprising an optical isolator between the optical input and the coupler.

10. Apparatus according to claim 1 wherein the coupler is an optical circulator.

11. Apparatus according to claim 1 and comprising an optical isolator between the coupler and the preamplifier.

12. A method for providing optical radiation, which method comprises:

provrding an optical input, a coupler, a first semiconductor amplifier, a preamplifier, a power amplifier, an output fibre, and a resonant cavity that are configured in series;

providing a non-linear crystal in the resonant cavity;

amplifying input optical radiation received by the optical input by the first semiconductor amplifier, the preamplifier, and the power amplifier;

outputting the optical radiation from the power amplifier to the resonant cavity via the output fibre;

forming a ring laser by connecting the resonant cavity to the optical input;

configuring a controller to cause the waveguide to operate in saturation thereby enabling a reduction of at least one of spectral noise, temporal noise, and non-linear wavelength conversion of the optical radiation;

using a detector to detect for an absence of the input optical radiation; and reducing an optical gain of the first semiconductor amplifier in order to prevent the first semiconductor amplifier from lasing, wherein the first semiconductor amplifier comprises a waveguide having a low reflecting facet;

the first semiconductor amplifier is in a double pass configuration such that the low reflecting facet is connected to both the optical input and the preamplifier via the coupler.

13. A method according to claim 12 and comprising the steps of causing the resonant cavity to provide optical feedback in the form of the input optical radiation, and configuring the first semiconductor amplifier to supply optical radiation to the preamplifier in the event that the optical feedback is lost in order to prevent failure of the power amplifier.

14. A method according to claim 13 and including the steps of using a detector to detect for an absence of the input optical radiation, and reducing an optical gain of the first semiconductor amplifier in order to prevent the first semiconductor amplifier from lasing.

15. A method according to claim 12 wherein the waveguide of the first semiconductor amplifier is a curved waveguide.

16. A method according to claim 12 wherein the power amplifier is an optical fiber amplifier.

17. A method according to claim 12 wherein the power amplifier is a slab amplifier.

18. A method for preventing failure of a ring laser, which method comprises:

providing an optical input, a coupler, a first semiconductor amplifier, a preamplifier, a power amplifier, an output fibre, and a resonant cavity that are configured in series;

providing a non-linear crystal in the resonant cavity;

forming the ring laser by connecting the resonant cavity to the optical input;

amplifying input optical radiation received by the optical input by the first semiconductor amplifier, the preamplifier, and the power amplifier;

outputting optical radiation from the power amplifier to the resonant cavity via the output fibre;

configuring a controller to cause the waveguide to operate in saturation thereby enabling a reduction of at least one of spectral noise, temporal noise, and non-linear wavelength conversion of the optical radiation;

causing the resonant cavity to provide optical feedback in the form of the input optical radiation; and configuring the first semiconductor amplifier to supply optical radiation to the preamplifier in the event that the optical feedback is lost in order to prevent failure of the power amplifier, wherein the first semiconductor amplifier comprises a waveguide having a low reflecting facet; and the first semiconductor amplifier is in a double pass configuration such that the low reflecting facet is connected to both the optical input and the preamplifier via the coupler.

19. A method according to claim 18 and including the steps of using a detector to detect for an absence of the input optical radiation, and reducing an optical gain of the first semiconductor amplifier in order to prevent the first semiconductor amplifier from lasing.

* * * * *